United States Patent
Zhuang et al.

(10) Patent No.: US 7,098,043 B2
(45) Date of Patent: Aug. 29, 2006

(54) PCMO SPIN-COAT DEPOSITION

(75) Inventors: Wei-Wei Zhuang, Vancouver, WA (US); Lisa H. Stecker, Vancouver, WA (US); Gregory M. Stecker, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 352 days.

(21) Appl. No.: 10/759,468

(22) Filed: Jan. 15, 2004

(65) Prior Publication Data

US 2005/0158994 A1 Jul. 21, 2005

(51) Int. Cl.
*H01L 21/00* (2006.01)

(52) U.S. Cl. .......................... 438/3; 438/781; 438/782; 257/295

(58) Field of Classification Search ................ 438/663, 438/3
See application file for complete search history.

(56) References Cited

U.S. PATENT DOCUMENTS 6,664,117 B1 * 12/2003 Zhuang et al. ................ 438/3

2003/0148545 A1 * 8/2003 Zhuang et al. ................ 438/3

* cited by examiner

*Primary Examiner*—Hoai Pham
*Assistant Examiner*—Abul Kalam
(74) *Attorney, Agent, or Firm*—Law Office of Gerald Maliszewski; Gerald Maliszewski

(57) ABSTRACT

A $Pr_{1-x}Ca_xMnO_3$ (PCMO) spin-coat deposition method for eliminating voids is provided, along with a void-free PCMO film structure. The method comprises: forming a substrate, including a noble metal, with a surface; forming a feature, such as a via or trench, normal with respect to the substrate surface; spin-coating the substrate with acetic acid; spin-coating the substrate with a first, low concentration of PCMO solution; spin-coating the substrate with a second concentration of PCMO solution, having a greater concentration of PCMO than the first concentration; baking and RTA annealing (repeated one to five times); post-annealing; and, forming a PCMO film with a void-free interface between the PCMO film and the underlying substrate surface. The first concentration of PCMO solution has a PCMO concentration in the range of 0.01 to 0.1 moles (M). The second concentration of PCMO solution has a PCMO concentration in the range of 0.2 to 0.5 M.

14 Claims, 5 Drawing Sheets

IRIT MEMORY ARRAY

IRID MEMORY ARRAY

PCMO SPIN-COAT DEPOSITION

BACKGROUND OF THE INVENTION

1. Field of the Invention

This invention generally relates to integrated circuit (IC) fabrication and, more particularly, to a PCMO deposition process that forms a void-free interface with an underlying noble metal substrate.

2. Description of the Related Art $Pr_{1-x}Ca_xMnO_3$ (PCMO) thin films have been found to have unique resistance change properties. With the application of a narrow nanosecond pulse, having an amplitude of 5 volts and a duration of 100 nanoseconds, the resistance can be changed to a high resistant state. Likewise, if a wider microsecond pulse is applied, the resistance can be reset to its initial (low-resistance) state. The observed change in resistance states is in the range of one to three orders of magnitude. Further, a resistance state changes can be affected in a PCMO film with the application of an opposite amplitude polarity narrow (nanosecond range) pulses. Thus, the resistance state of the PCMO film can be controlled using uni-polarity (a narrow and wide pulse having the same amplitude polarity) and bipolar (opposite amplitude polarity narrow pulses) programming. These programming characteristics make the PCMO well suited for use in memory cells and resistor RAM (RRAM) applications. These memory cell devices typically employ at least one electrode made, at least partially, from a noble metal, adjacently located to the PCMO memory resistor material.

There are many methods used for PCMO thin film deposition, such as physical vapor deposition (PVD), metalorganic chemical vapor deposition (MOCVD), and spin-coating. Of the three, spin-coating is one of the best candidates for the large scale manufacturing, as it is a relatively low cost, easy process.

FIG. 1 is a drawing depicting a PCMO film, formed using a conventional spin-coating process, overlying a Pt electrode (prior art). As can be seen in the figure, a void is formed in the interface between the PCMO and Pt layers. The problem is likely a result of the poor wetting properties of the PCMO spin-coating solution on the Pt surface. These voids are extremely detrimental to performance of RRAM devices. The voids encourage the formation of shorts between the top and bottom electrodes and degrade (increase) the leakage current. Further, the voids may result in the PCMO film being peeled from the Pt substrate during subsequent fabrication processes, such as during a chemical mechanical polish (CMP) step.

It would be advantageous if PCMO film could be consistently formed, without voids, on a noble metal substrate.

It would be advantageous if the above-mentioned void-free PCMO film could be formed using a spin-coating process.

SUMMARY OF THE INVENTION

The present invention describes a novel spin-coating process that eliminates the formation of voids at the bottom of both trenches and vias, when PCMO is spin-coated onto a noble metal substrate. SEM pictures indicate the voids are often formed with PCMO thin films that are spin-coated using conventional processes. Experimental results show that these voids are eliminated when the present invention spin-coating process is used.

Accordingly, a $Pr_{1-x}Ca_xMnO_3$ (PCMO) spin-coat deposition method is provided for eliminating voids. The method comprises: forming a substrate, including a noble metal, with a surface; forming a feature, such as a via or trench, normal with respect to the substrate surface; spin-coating the substrate with acetic acid; spin-coating the substrate with a first, low concentration of PCMO solution; spin-coating the substrate with a second concentration of PCMO solution, having a greater concentration of PCMO than the first concentration; baking and rapid thermal annealing (RTA), repeated one to five times; post-annealing; and, forming a PCMO film with a void-free interface between the PCMO film and the underlying substrate surface.

The first concentration of PCMO solution has a PCMO concentration in the range of 0.01 to 0.1 moles (M). The second concentration of PCMO solution has a PCMO concentration in the range of 0.2 to 0.5 M.

Baking and RTA typically includes the following steps: baking the substrate at a temperature in the range of 120 to 180 degrees C. for approximately 1 minute; baking the substrate at a temperature in the range of 200 to 250 degrees C. for approximately 1 minute; and, RTA at a temperature in the range of 400 to 600 degrees C. for a time in the range between 2 and 15 minutes. Post-annealing includes post-annealing at a temperature in the range of 500 to 600 degrees C. for a time in the range of 5 minutes to 2 hours.

Additional details of the above-described method, a void-free PCMO film structure, and PCMO void-free RRAM memory devices are provided below.

DETAILED DESCRIPTION OF THE PREFERRED EMBODIMENTS

Figure 2A:
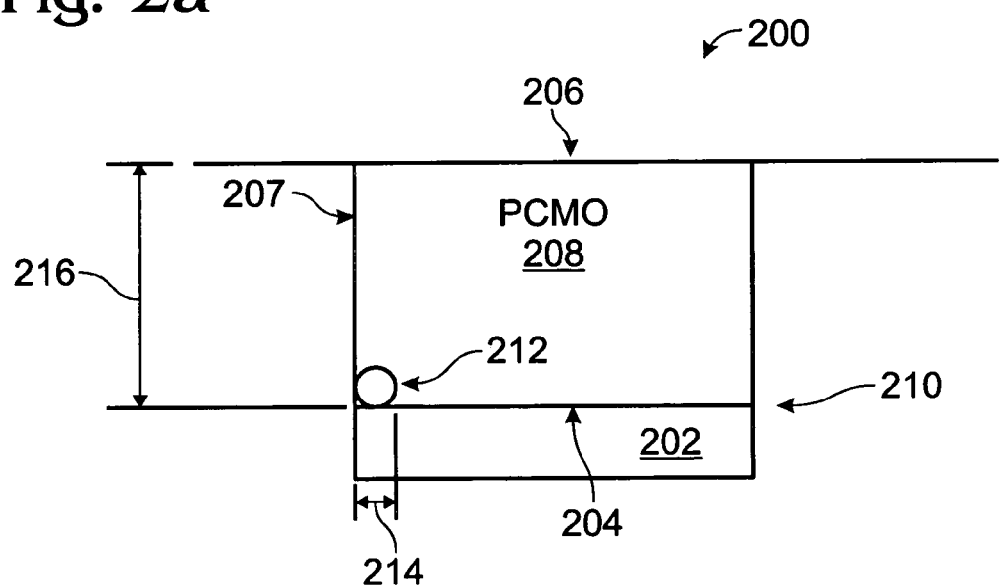
FIG. 2a is a partial cross-sectional view of the present invention void-free PCMO film structure.

FIG. 2a is a partial cross-sectional view of the present invention void-free PCMO film structure. The structure 200 comprises a substrate 202, including a noble metal, with a surface 204. The substrate 202 can be a material such as Pt, Rh, Ir, Pt—Rh, Pt—Ir, or Ir—Rh. However, other noble metals, noble metal compounds, and even other metals besides noble metals can be used in other aspects of the invention. A feature 206 is shown that is normal with respect to the substrate surface 204. Alternately stated, the feature 206, which can be either a via or a trench, has an element or structure, such as a sidewall 207, that is formed in a vertical plane perpendicular to the horizontal surface 204. Note, the feature 206 may also have an element or structure, such as a via or trench bottom surface formed in a plane that is parallel to the surface 204.

A PCMO film 208 overlies the substrate surface 204. The $Pr_{1-x}Ca_xMnO_3$ film 208 X variable may be in the range of 0.1 to 0.6. A void-free interface 210 is formed between the PCMO film 208 and the substrate surface 204. Alternately expressed, the void-free interface 210 includes voids 212 having a diameter 214 of less than 50 Å between the PCMO film 208 and the underlying feature 208. Typically, the PCMO film 208 has a thickness 216 in the range of 400 to 5000 Å. It should be understood that, as of this writing, the resolution of a scanning electron-beam microscope (SEM) technology is approximately 50 Å. Using SEM, no voids can be detected in the present invention PCMO interface 210. Therefore, the size of the voids 212 in the present invention structure 200 may actually be even smaller than 50 Å. Alternately stated, the structure 200 has a void-free interface, with respect to a 50 Å (SEM) resolution.

Figure 2B:
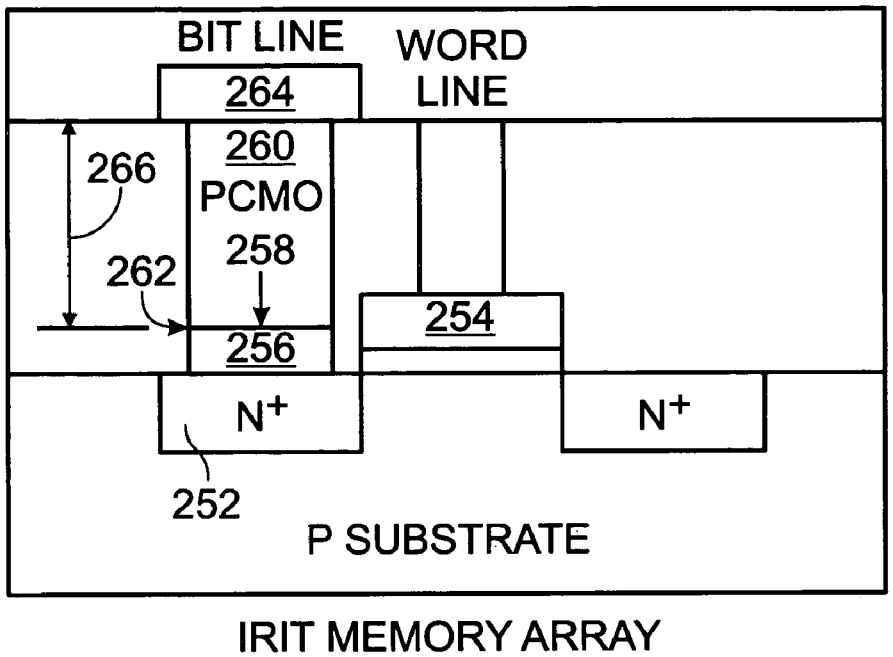
FIGS. 2b and 2c are partial cross-sectional views of the present invention resistor RAM (RRAM) memory cell with a void-free PCMO electrode interface.
Figure 2C:
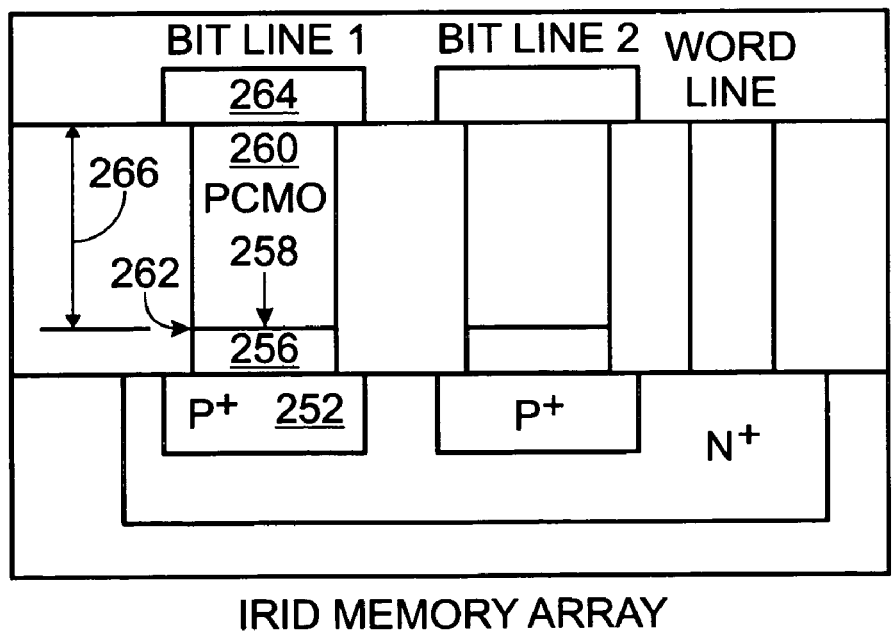

FIGS. 2b and 2c are partial cross-sectional views of the present invention resistor RAM (RRAM) memory cell with a void-free PCMO electrode interface. FIG. 2b depicts a one-resistor/one-transistor (1R1T) structure, and FIG. 2c depicts a one-resistor/one diode (1R1D) structure. The following description is intended to apply to the memory cell device 250 of either FIG. 2b or 2c. The device 250 comprises a semiconductor active region 252, which can be either a CMOS transistor source or a transistor drain (FIG. 2b), or doped Si region forming part of a P/N diode junction (FIG. 2c). Also shown is a CMOS transistor gate 254 (FIG. 2b). A bottom electrode 256, including a noble metal, with a surface 258, overlies the active region 252. A PCMO film 260 overlies the bottom electrode surface 258. A void-free interface 262 is formed between the PCMO film 260 and the bottom electrode surface 258. A top electrode 264 overlies the PCMO film 260.

As in the description of FIG. 2a, the void-free interface 262 includes voids having a diameter of less than 50 Å (not shown) between the PCMO film 260 and the bottom electrode surface 258. The bottom electrode 256 is a material selected from the group including Pt, Rh, Ir, Pt—Rh, Pt—Ir, and Ir—Rh. The top electrode 264 may be made from one of the same group of materials, although other materials are also used in the art. The PCMO 260 film has a thickness 266 in the range of 400 to 5000 Å.

FUNCTIONAL DESCRIPTION

Figure 1:
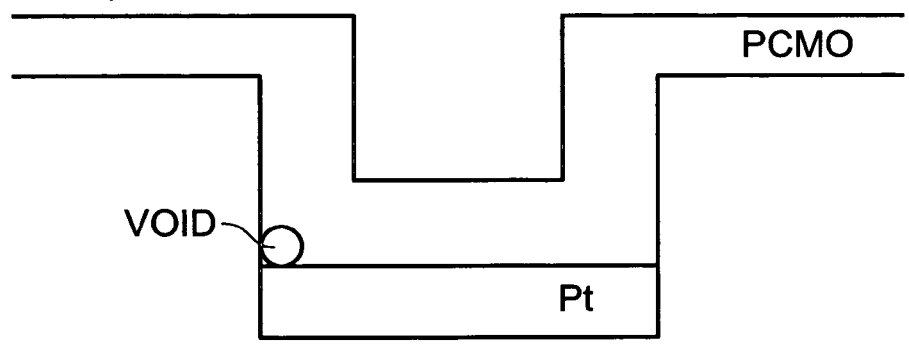
FIG. 1 is a drawing depicting a PCMO film, formed using a conventional spin-coating process, overlying a Pt electrode (prior art).
Figure 3:
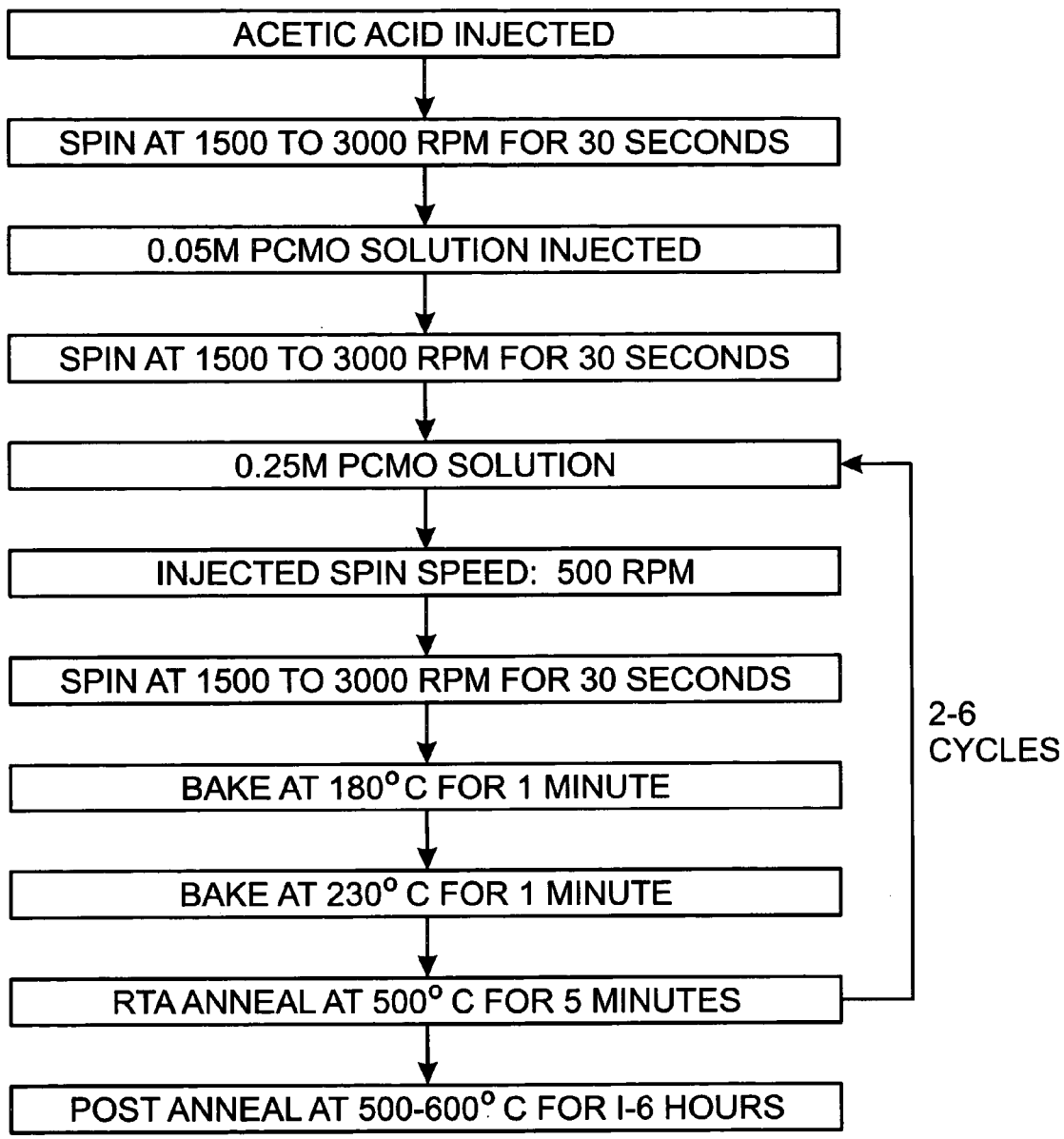
FIG. 3 is a flowchart illustrating an exemplary PCMO spin-coating process.

FIG. 3 is a flowchart illustrating an exemplary PCMO spin-coating process. This spin-coating process includes the injection of a 0.25 molar (M) concentration PCMO solution onto a wafer surface, two or three low temperature baking steps on hot plate, RTA baking at high temperatures, and the final post-annealing. In this example, the final integrated product is Pt/PCMO/Pt/Ti/SiO$_2$/wafer. This process, however, is susceptible to the formation of voids at the bottom of trench or vias, as indicated in SEM pictures (see the representation in FIG. 1).

Figure 4:
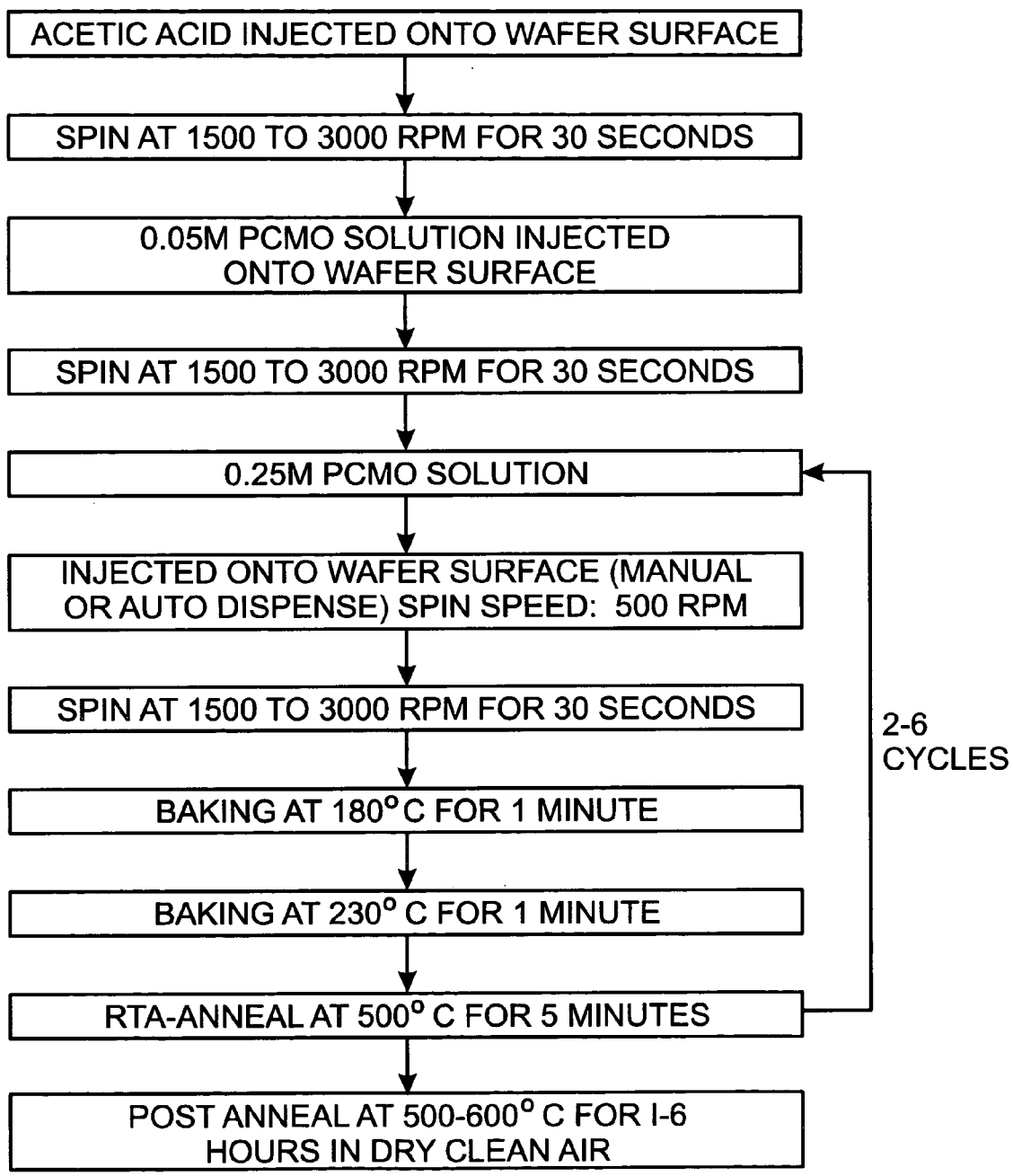
FIG. 4 is a flowchart illustrating the present invention PCMO spin-coating process.

FIG. 4 is a flowchart illustrating the present invention PCMO spin-coating process. To solve the above-mentioned void problem, the present invention spin-coating process, first, uses acetic acid to wet the wafer surface. Then, a low concentration PCMO solution is applied for further wafer surface wetting. After these two novel steps, the spin-coating process can be continued using more conventional processes. The present invention spin-coating process eliminates the formation of voids in both trench or vias bottoms (see FIG. 2a).

Figure 5:
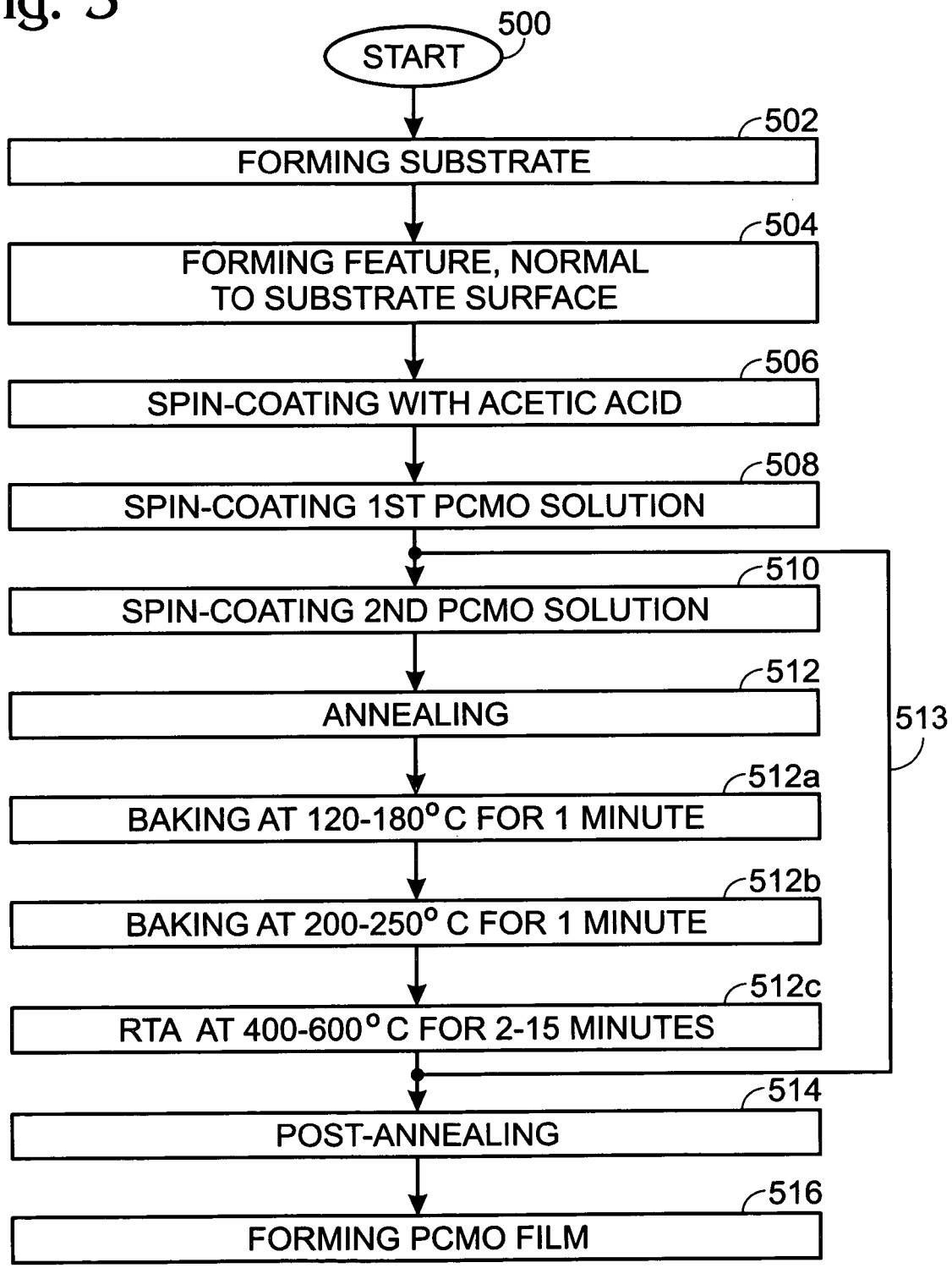
FIG. 5 is a flowchart illustrating an alternate aspect of the PCMO spin-coat deposition method for eliminating voids.

FIG. 5 is a flowchart illustrating an alternate aspect of the PCMO spin-coat deposition method for eliminating voids. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 500.

Step 502 forms a substrate, including a noble metal, with a surface. Step 504 forms a feature, normal with respect to the substrate surface. Step 506 spin-coats the substrate with acetic acid. Step 508 spin-coats the substrate with a first, low concentration of PCMO solution. Step 510 spin-coats the substrate with a second concentration of PCMO solution, having a greater concentration of PCMO than the first concentration. Step 512 bakes and rapid thermal anneals (RTA). Step 514 post-anneals. Step 516 forms a PCMO film overlying the substrate surface. In some aspects, Step 516 includes forming a void-free interface between the PCMO film and the underlying substrate surface. In other aspects, Step 516 forms voids having a diameter of less than 50 Å between the PCMO film and the substrate surface. Alternately stated, the interface is void-free with respect to a resolution of 50 Å. In yet another aspect, Step 516 forms a PCMO film having a thickness in the range of 400 to 5000 Å.

Typically, forming a feature, normal with respect to the substrate surface, in Step 504 includes forming a surface-normal feature such as a trench or via. However, the invention is also applicable to more complicated structures that are not explicitly described herein.

In one aspect, spin-coating the substrate with a first concentration of PCMO solution (Step 508) includes applying a PCMO concentration in the range of 0.01 to 0.1 M. Spin-coating the substrate with a second concentration of PCMO solution (Step 510) includes applying a PCMO concentration in the range of 0.2 to 0.5 M.

In another aspect, spin-coating the substrate with acetic acid (Step 506) includes spinning the substrate at a rate in the range between 1500 and 4000 revolutions per minute (RPM) for a time in the range of 30 to 60 seconds.

In one aspect, spin-coating the substrate with a first concentration PCMO solution (Step 508) includes applying the PCMO solution while spinning the substrate at a rate in the range of 300 to 1000 RPM. Likewise, spin-coating the substrate with a second concentration PCMO solution (Step 510) includes applying the PCMO solution while spinning the substrate at a rate in the range of 300 to 1000 RPM.

In other aspect, spin-coating the substrate with a first concentration of PCMO solution (Step 508) includes spinning the substrate at a rate in the range of at 1500 to 3000 RPM for a time in the range of 30 to 60 seconds. Likewise, spin-coating the substrate with the second concentration of PCMO solution (Step 510) includes spinning the substrate at a rate in the range of 1500 to 3000 RPM for a time in the range of 30 to 60 seconds.

In another aspect, baking and RTA (Step 512) includes substeps. Step 512a bakes the substrate at a temperature in the range of 120 to 180 degrees C. for approximately 1 minute. Step 512b bakes the substrate at a temperature in the range of 200 to 250 degrees C. for approximately 1 minute. Step 512c RTAs at a temperature in the range of 400 to 600 degrees C. for a time in the range between 2 and 15 minutes.

Some aspects of the method include an additional step. Step 513 repeats the second concentration of PCMO spin-coating (Step 510) and baking and RTA (Step 512) procedures 1 to 5 iterations. Alternately stated, Step 513 is the reiteration of Steps 510 and 512, from 1 to 5 times.

Post-annealing in Step 514 may include post-annealing at a temperature in the range of 500 to 600 degrees C. for a time in the range of 5 minutes to 2 hours. In other aspect, Step 514 includes post-annealing in an environment such as air or oxygen environments.

In one aspect, forming a substrate, including a noble metal (Step 502) includes forming a substrate from a material such as Pt, Rh, Ir, Pt—Rh, Pt—Ir, or Ir—Rh.

A PCMO spin-coating process and a void-free PCMO/noble metal interface, and an RRAM void-free PCMO electrode interface have been described. Examples of specific substrate materials have been used to illustrate the invention, but the invention is not necessarily limited to just these examples. Likewise, process variable have been used to clarify. However, the invention is not necessarily limited to just the noted exemplary molar ratios, temperatures, and RPMs. Further, two RRAM structure examples have been depicted to clarify the invention, but the invention is applicable to other RRAM structures. Other variations and embodiments of the invention will occur to those skilled in the art.

We claim:

1. A $Pr_{1-x}Ca_xMnO_3$ (PCMO) spin-coat deposition method for eliminating voids, the method comprising:
   forming a substrate, including a noble metal, with a surface;
   forming a surface-normal feature, normal with respect to the substrate surface;
   spin-coating the substrate with acetic acid;
   spin-coating the substrate with a first, low concentration of PCMO solution;
   spin-coating the substrate with a second concentration of PCMO solution, having a greater concentration of PCMO than the first concentration;
   baking and rapid thermal annealing (RTA);
   post-annealing; and,
   forming a PCMO film overlying the surface-normal feature.

2. The method of claim 1 wherein forming a PCMO film overlying the surface-normal feature includes forming a void-free interface between the PCMO film and the underlying substrate surface.

3. The method of claim 1 wherein forming a surface-normal feature, normal with respect to the substrate surface, includes forming a surface-normal feature selected from the group including a trench and a via.

4. The method of claim 1 wherein spin-coating the substrate with a first concentration of PCMO solution includes and,
   wherein spin-coating the substrate with a second concentration of PCMO solution includes applying a PCMO concentration in the range of 0.2 to 0.5 M.

5. The method of claim 4 wherein spin-coating the substrate with a first concentration PCMO solution includes applying the PCMO solution while spinning the substrate at a rate in the range of 300 to 1000 RPM; and,
   wherein spin-coating the substrate with a second concentration PCMO solution includes applying the PCMO solution while spinning the substrate at a rate in the range of 300 to 1000 RPM.

6. The method of claim 1 wherein spin-coating the substrate with acetic acid includes spinning the substrate at a rate in the range between 1500 and 4000 revolutions per minute (RPM) for a time in the range of 30 to 60 seconds.

7. The method of claim 1 wherein spin-coating the substrate with a the first concentration of PCMO solution includes spinning the substrate at a rate in the range of at 1500 to 3000 RPM for a time in the range of 30 to 60 seconds; and,
   wherein spin-coating the substrate with the second concentration of PCMO solution includes spinning the substrate at a rate in the range of 1500 to 3000 RPM for a time in the range of 30 to 60 seconds.

8. The method of claim 1 wherein baking and RTA includes:
   baking the substrate at a temperature in the range of 120 to 180 degrees C. for approximately 1 minute;
   baking the substrate at a temperature in the range of 200 to 250 degrees C. for approximately 1 minute; and,
   rapid thermal annealing at a temperature in the range of 400 to 600 degrees C. for a time in the range between 2 and 15 minutes.

9. The method of claim 8 further comprising:
   repeating the second concentration of PCMO spin-coating, and baking and IRTA procedures 1 to 5 iterations.

10. The method of claim 9 wherein post-annealing includes post-annealing at a temperature in the range of 500 to 600 degrees C. for a time in the range of 5 minutes to 2 hours.

11. The method of claim 10 wherein post-annealing includes post-annealing in an environment selected from the group including air and oxygen environments.

12. The method of claim 1 wherein forming a substrate, including a noble metal includes forming a substrate from a material selected from the group including Pt, Rh, Ir, Pt—Rh, Pt—Ir, and Ir—Rh.

13. The method of claim 1 wherein forming a void-free interface between the PCMO film and the underlying substrate surface includes forming voids having a diameter of less than 50 A between the PCMO film and the substrate surface.

14. The method of claim 1 wherein forming a PCMO film includes forming a PCMO film having a thickness in the range of 400 to 5000 A.

* * * * *